United States Patent
Yamaguchi et al.

[11] Patent Number: 6,100,106
[45] Date of Patent: Aug. 8, 2000

[54] FABRICATION OF NITRIDE SEMICONDUCTOR LIGHT-EMITTING DEVICE

[75] Inventors: Atsushi Yamaguchi; Akitaka Kimura; Chiaki Sasaoka, all of Tokyo, Japan

[73] Assignee: NEC Corporation, Tokyo, Japan

[21] Appl. No.: 09/192,304

[22] Filed: Nov. 17, 1998

[30] Foreign Application Priority Data

Nov. 17, 1997 [JP] Japan .................................. 9-315451

[51] Int. Cl.$^7$ .................................................. H01L 21/00
[52] U.S. Cl. ......................... 438/46; 438/931; 438/967; 117/952
[58] Field of Search .................................... 438/22, 46, 47, 438/479, 931, 967; 257/76, 77; 372/43; 117/952

[56] References Cited

U.S. PATENT DOCUMENTS 5,081,519 1/1992 Nishimura .
5,727,008 3/1998 Koga .

FOREIGN PATENT DOCUMENTS 8-64912 3/1996 Japan .
8-316582 11/1996 Japan .

OTHER PUBLICATIONS

Domen et al., Extended Abstracts No. 1 of the 43$^{rd}$ Meeting of Applied Physics Related Conference, 1996, p. 336.

S. Nakamura et al., "InGaN–Based Multi–Quantum–Well––Structure Laser Diodes", *Jpn. J. Appl. Phys.*, vol. 35, 1996, pp. L74–L76.

K. Domen et al., :Optical Gain for Wurtzite GaN with Anisotropic Strain in C Plane *Appl. Phys. Lett.*, vol. 70, No. 8, Feb. 24, 1997, pp. 987–989.

A. Kimura et al., "Selective Growth of GaN with Lateral Growth by Metalorganic Vapor Phase Epitaxy", *Kaioyoo Butsurigaku Kaigaku Jutsu Koenkai Yokoshu*, Autumn No. 58, 2p–Q–13, 1997, pp. 265.

T. Tanaka et al., "Stimulated Emission from Rectangular Cross–Sectional GaN Optical Waveguides by Photo–Pumping and Stripe Design of Optical Waveguides Formed with a Selectively Grown GaInN/GaN Buried Heterosructure", *Solid–State Electronics*, vol. 41, No. 2, 1997, pp. 255–261.

*Primary Examiner*—Charles Bowers
*Assistant Examiner*—Keith Christianson
*Attorney, Agent, or Firm*—Sughrue, Mion, Zinn, Macpeak & Seas, PLLC

[57] ABSTRACT

A process for producing a semiconductor light-emitting device, which comprises forming, on a substrate by crystal growth, a gallium nitride type compound semiconductor layer having a crystal face (0,0,0,1) which can be utilized as the end surface of an optical waveguide or as a cavity mirror surface.

12 Claims, 3 Drawing Sheets

FABRICATION OF NITRIDE SEMICONDUCTOR LIGHT-EMITTING DEVICE

BACKGROUND OF THE INVENTION

1. Field of the Invention:

The present invention relates to a process for producing a III–V group compound semiconductor light emitting device, particularly a nitrogen-containing III–V group compound semiconductor light-emitting device having nitrogen-containing III–V group compound semiconductor layer.

2. Description of the Related Art:

Gallium nitride (GaN) and aluminum nitride (AlN) have large band gaps and their band gap energies correspond to an ultraviolet light. Alloyed crystals between (1) gallium nitride and/or aluminum nitride and (2) indium nitride (InN), i.e. indium gallium nitride (InGaN), indium aluminum nitride (InAlN) and indium gallium aluminum nitride (InGaAlN) also have band gaps corresponding to a blue light or an ultraviolet light, depending upon their compositions. Therefore, these nitrogen-containing III–V group compound semiconductors (hereinafter each referred to as "nitride semiconductor") are drawing attention as a material for light (blue light or ultraviolet light)-emitting device, or as a material for high voltage-resistant or high temperature-resistant environmental electronic device. Nakamura et al. report, in Jpn. J. Appl. Phys. Vol. 35 (1996), p. L74, production of blue light laser device using the above compound semiconductors. FIG. 3 shows a sectional view of this laser device. As shown in FIG. 3, the laser device by Nakamura et al. has a structure obtained by forming, on a sapphire substrate 301 having a c-face [(0001) face] on the surface, a gallium nitride buffer layer 102 of 30 nm in thickness, a Si-doped n type gallium nitride layer 103 of 3 $\mu$m in thickness, a Si-doped n type $In_{0.1}Ga_{0.9}N$ layer 104 of 0.1 $\mu$m in thickness, a Si-doped n type $Al_{0.15}Ga_{0.85}N$ layer 105 of 0.4 $\mu$m in thickness, a Si-doped n type gallium nitride layer 106 of 0.1 $\mu$m in thickness, a multiple quantum well layer 107 wherein an $In_{0.2}Ga_{0.8}N$ quantum well layer of 2.5 nm in thickness and an $In_{0.05}Ga_{0.95}N$ barrier layer of 5 nm in thickness are repeated 26 times, a Mg-doped p type $Al_{0.2}Ga_{0.8}N$ layer 108 of 20 nm in thickness, a Mg-doped p type gallium nitride layer 109 of 0.1 $\mu$m in thickness, a Mg-doped p type $Al_{0.15}Ga_{0.85}N$ layer 110 of 0.4 $\mu$m in thickness and a Mg-doped p type gallium nitride layer 111 of 0.5 $\mu$m in thickness, in this order. On the uppermost p type gallium nitride layer 111 is formed a p electrode 112 consisting of two layers of nickel (Ni) and gold (Au); on the n type gallium nitride layer 103 is formed an n type electrode 113 consisting of two layers of titanium (Ti) and aluminum (Al). Used as the cavity mirror surface of the laser is an etched surface obtained by reactive ion etching. Or, as described in Japanese Patent Application Kokai (Laid-Open) No. 64912/1996 regarding "Semiconductor Light-Emitting Device and Production Thereof", on the r- or m-face of a sapphire substrate is formed a gallium nitride type compound semiconductor layer; the layer is subjected to etching to expose the (0,0,0,1) face; and this face is used as the end surface of an optical waveguide. Thus, in conventional nitride semiconductor lasers, the cavity mirror surface is formed by etching or by cleavage.

In these laser devices, however, the threshold current density is high; the life of room-temperature continuous oscillation is short; and no practical applicability is attained.

The threshold current density of semiconductor laser device depends greatly on the density of states at around the valence band top of the active layer semiconductor. A nitride semiconductor, having a very small spin-orbit splitting energy, has three bands at around the valence band top and has a large density of states, which is one reason for the high threshold current density of the nitride semiconductor laser.

Further, in conventional nitride semiconductor lasers, nitride compound semiconductors different in chemical composition are used in the active layer. Therefore, biaxial strain is inevitably introduced into the active layer owing to the difference in lattice constant. This strain gives rise to an internal electric field in a direction perpendicular to the substrate surface, owing to a piezoelectric effect. As a result, electrons and holes are separated spatially in the active layer; the overlapping of the wave functions is decreased; and the efficiency of recombination and light emission is reduced.

The above matters are presumed to be the reasons for high threshold current density in conventional nitride semiconductor lasers.

In addition, the cavity mirror surface of prior art formed by subjecting a gallium nitride type compound semiconductor layer to reactive ion etching has had poor flatness and consequently a large mirror loss. Also, the cavity mirror surface produced by cleavage has been unable to have good flatness because the sapphire substrate and the cleavage plane of nitride semiconductor are not well matched.

SUMMARY OF THE INVENTION

The present invention was made in view of the above-mentioned problems of the prior art, and is intended to provide a process for producing a nitride semiconductor laser device, in which device the precision of the cavity mirror surface is improved and the threshold current density is lowered by introduction of anisotropic strain into the c-face.

The present invention lies in a process for producing a semiconductor light-emitting device, which comprises forming, on a substrate by crystal growth, a gallium nitride type compound semiconductor layer having a crystal face (0,0,0,1) which can be utilized as the end surface of an optical waveguide or as a cavity mirror surface.

Preferably, the above process has the following features.

1. The crystal growth is conducted on the substrate selectively.
2. The gallium nitride type compound semiconductor layer comprises a layer of one kind selected from gallium nitride, aluminum nitride and indium nitride, or a layer of a mixed crystal of at least two kinds selected from the above nitrides.
3. The axis "c" of the gallium nitride type compound crystal is parallel to the surface of the substrate.
4. The surface of the substrate on which crystal growth is to be conducted, is the r-face [(1,-1,0,2) face] of sapphire or the (1,0,-1,0) face of hexagonal system silicon carbide.
5. One side of the selective crystal growth area is the (1,1,-2,0) direction of the substrate surface on which crystal growth is to be conducted.

In the present process for producing a nitride semiconductor light-emitting device, the axis "c" of the nitride is parallel to the surface of the substrate and the c-face facet of the nitride is used as a cavity mirror surface. As a result, the mirror surface has improved flatness; anisotropic strain is introduced into the c-face and the density of states is lowered; it is possible to use a polarized light component capable of yielding the largest optical gain, as a TE polarized light for laser oscillation; and the threshold current density can be lowered.

The above and other objects, features and advantages of the present invention will become apparent from the following description with reference to the accompanying drawings which illustrate examples of the present invention.

DESCRIPTION OF THE PREFERRED EMBODIMENTS

Figure 1:
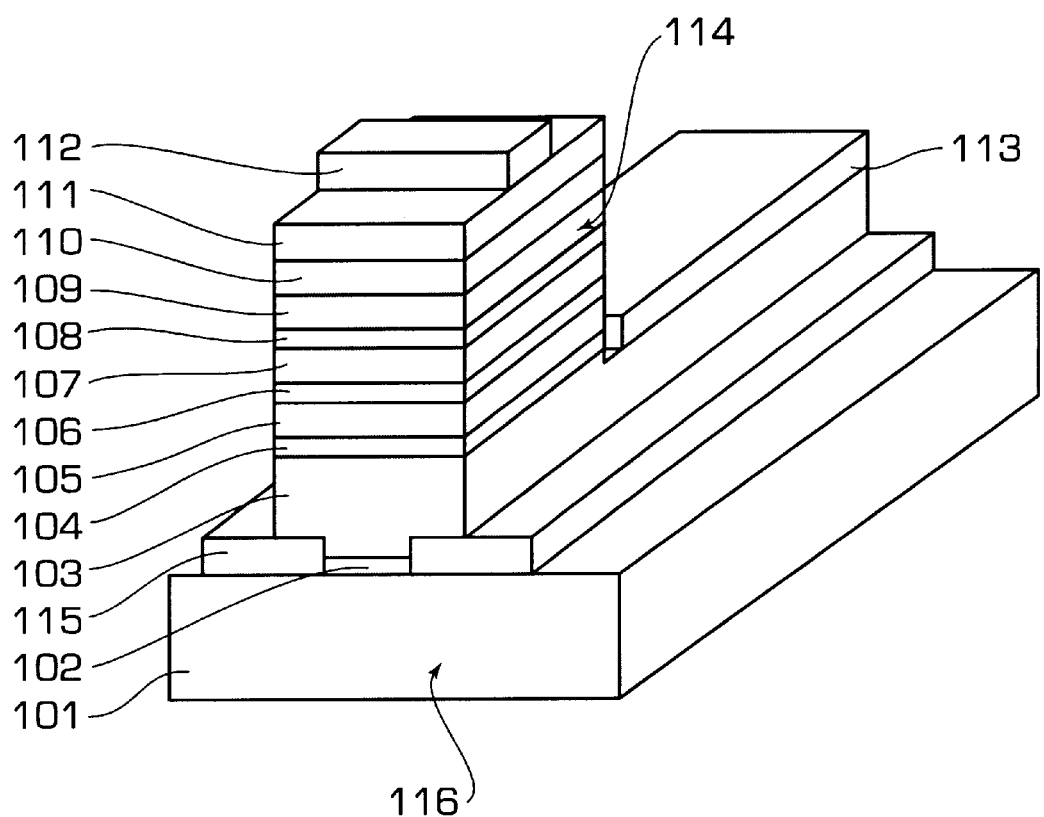
FIG. 1 is a schematic perspective view of a laser device produced on the r-face of a sapphire substrate according to the present process.

The nitride semiconductor light-emitting device produced by the present process is a laser device of low threshold current density. It is explained below. To obtain a nitride semiconductor laser of low threshold current density, it is believed to be most effective to introduce strain so that the two bands (generally called "A band" and "B band"), substantially degenerating at around the top of valence band, are split from each other. In semiconductor lasers, in order to make the band gap of the active layer smaller than the band gaps of the layers on and beneath the active layer, a double hetero structure or a quantum well structure is formed by employing a nitride semiconductor of different chemical composition. In this connection, there arises mismatching of lattice constants in the hetero structure and biaxial strain is inevitably introduced into the active layer.

In conventional gallium nitride type compound semiconductor laser structures, the nitride semiconductor has a crystal structure of wurtzite and its axis "c" is perpendicular to the substrate surface. Since the biaxial strain introduced owing to the mismatching of lattices is isotropic in the substrate surface, the strain introduced into the nitride semiconductor of the active layer is isotropic in the c-face. As Domen et al. report in p. 336 of Extended Abstracts No. 1 of the 43rd Meeting, 1996 of the Japan Society of Applied Physics and Related Societies, the isotropic strain in the c-face can hardly achieve a large split between the A and B bands of the valence band. In order to achieve a large split between the A and B bands and lower the threshold current density of the laser device, it is necessary to introduce anisotropic strain into the c-face of the active layer of the laser device.

The nitride produced by the present invention has a feature in that its axis "c" is parallel to the surface of the substrate used. Therefore, the c-face of the nitride is perpendicular to the substrate surface; the strain caused by the lattice mismatching with the substrate crystal is anisotropic in the c-face; in the nitride crystal, the split between the A and B bands at around the top of the valence band can be made large and the density of states of the valence band is lowered; in the nitride semiconductor laser device structure using the nitride, the threshold current density can be lowered. The growth of nitride in such a way that its axis "c" is parallel to the surface of the substrate used, can be achieved by using, as the substrate surface, the r-face of sapphire or the (1,0−1,0) face of silicon carbide of hexagonal system.

In the present nitride semiconductor laser device structure using a nitride whose axis "c" is parallel to the surface of the substrate used, the component of piezoelectric field (caused by strain) perpendicular to the substrate surface is zero in the nitride crystal; therefore, there can be removed a bad effect (as seen in conventional nitride semiconductor lasers) that the component of piezoelectric field perpendicular to the substrate surface makes small the overlapping of the wave functions of electrons and holes, resulting in reduced efficiency of light emission. That is, since the TE polarized light emitted to the direction of axis "c" can be used for laser oscillation, improvement in optical gain is expectable and, in the case of a cavity using a c-face as the mirror surface, reduction in threshold value is expectable.

Next, description is made on the effect brought about by the high flatness of the resonance plane. As described previously, in conventional techniques for producing a nitride semiconductor laser, the mirror surface is formed by reactive ion etching or by cleavage; therefore, it has been difficult to form a flat cavity mirror surface. The c-face of nitride is a face of the nitride crystal which is most stable and easy to form and, therefore, is a face which can be formed in the highest flatness by crystal growth or by etching.

As reported in, for example, Japanese Patent Application Kokai (Laid-Open) No. 316582/1996, in some conventional nitride semiconductor laser structures wherein the c-face of nitride is parallel to the substrate surface, a m-face, i.e. a (1,0−1,0) face is formed by selective growth and is used as a mirror surface. However, the m-face is not formed so stably as a c-face and is difficult to form.

In the present process for producing a nitride semiconductor laser device, the facet formed by selective growth is used as a cavity mirror surface; thereby, the mirror surface has high flatness and the cavity formed has a low mirror loss. As a result, a laser device of low threshold current density is obtained.

EXAMPLE 1

FIG. 1 is a schematic perspective view of a nitride semiconductor laser device structure produced on the face of a sapphire substrate according to the present process. In FIG. 1, the nitride semiconductor laser device was produced by forming, on a sapphire substrate 101 whose surface is a sapphire r-face and on which a silicon dioxide film 115 having a linear aperture of 200 $\mu$m in width was formed, a gallium nitride buffer layer 102 of 30 nm in thickness, a Si-doped n type gallium nitride layer 103 of 3 $\mu$m in thickness, a Si-doped n type $In_{0.1}Ga_{0.9}N$ layer 104 of 0.1 $\mu$m in thickness, a Si-doped n type $Al_{0.15}Ga_{0.85}N$ layer 105 of 0.4 $\mu$m in thickness, a Si-doped n type gallium nitride layer 106 of 0.1 $\mu$m in thickness, a multiple quantum well layer 107 wherein an $In_{0.2}Ga_{0.8}N$ quantum well layer of 2.5 nm in thickness and an $In_{0.05}Ga_{0.95}N$ barrier layer of 5 nm in thickness were repeated 26 times, a Mg-doped p type $Al_{0.2}Ga_{0.8}N$ layer 108 of 20 nm in thickness, a Mg-doped p type gallium nitride layer of 0.1 $\mu$m in thickness, a Mg-doped p type $Al_{0.15}Ga_{0.85}N$ layer 110 of 0.4 $\mu$m in thickness, and a Mg-doped p type gallium nitride layer 111 of 0.5 $\mu$m in thickness, in this order by selective growth.

A study by the present inventors revealed that when a nitride is allowed to grow on the r-face of a sapphire substrate, the nitride grows so that the a-face [(1,1,−2,0) face] becomes its surface and consequently the axis "c" becomes parallel to the substrate surface. In the present Example as well, this (the axis "c" of a nitride formed on a substrate becomes parallel to the substrate surface) was confirmed by X-ray diffractometry. On the gallium nitride layer 111 (which is the uppermost layer) is formed a p electrode 112 consisting of two layers of nickel (Ni) and gold (Au); on the n type gallium nitride layer 103 is formed an n electrode 113 consisting of two layers of titanium (Ti) and aluminum (Al). The formation of semiconductor crystal layers 102, 103, 104, 105, 106, 107, 108, 109, 110 and 111 was conducted by a metalorganic chemical vapor deposition. According to a study by the present inventors, when one side of the aperture of linear selective growth area is directed to the (1,1,−2,0) direction of the surface of a substrate on which crystal growth is to be made, a nitride semiconductor grows on the substrate in a columnar structure so that the side of the column becomes a c-face facet which has the smallest growth speed. The c-face facet formed is a very flat plane and is perpendicular to the substrate surface and, therefore, can be utilized as an excellent cavity mirror surface. In the present Example, by utilizing this phenomenon, the aperture of silicon dioxide is directed to the (1,1,−2,0) direction of the surface of the substrate, i.e. a direction normal to the sapphire a-face 116 and there is formed, on the substrate, a nitride having, at a side, a flat c-face facet perpendicular to the substrate surface and usable as a cavity mirror surface 114. This cavity mirror surface was confirmed, by observation by a scanning type electron microscope, to be very flat. Further in the laser device of the present Example, since the nitride semiconductor layer has an axis "c" parallel to the substrate surface and has a wurtzite structure of hexagonal system, anisotropic strain is introduced into the c-face of the quantum well active layer and its density of states at around the top of the valence band is lowered. Furthermore, since the component of piezoelectric field perpendicular to the substrate surface is zero, there occurs no reduction in the probability of recombination of electrons and holes and the laser device has a low threshold current density. In this laser device, the threshold current density during 77K laser oscillation was lower than that of a conventional laser device formed on the c-face of a sapphire substrate.

The embodiment of the present Example is not restricted only to the semiconductor layer having a structure of FIG. 1 and is applicable also to when the crystal growth layer formed contains a mixed crystal of any desired composition between indium nitride, aluminum nitride and gallium nitride.

EXAMPLE 2

Figure 2:
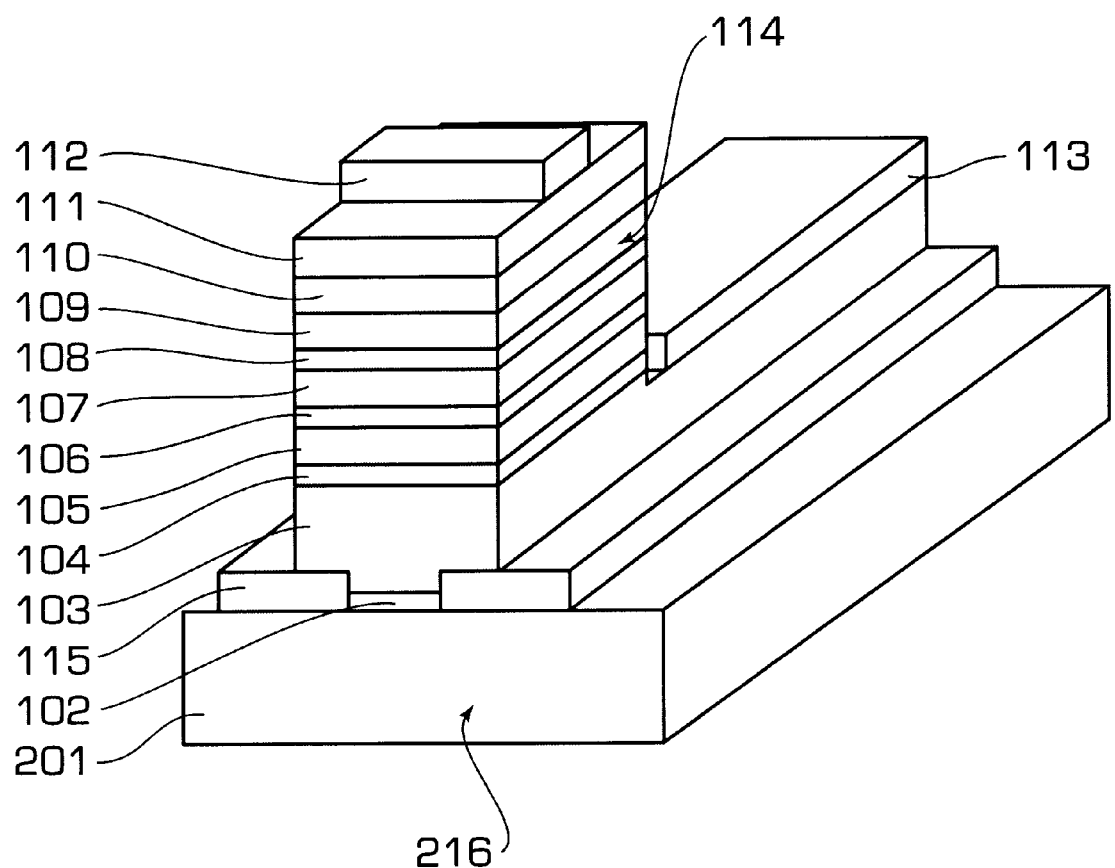
FIG. 2 is a schematic perspective view of a laser device produced on the (1,−1,0,0) face of a 6H type silicon carbide substrate according to the present process.
Figure 3:
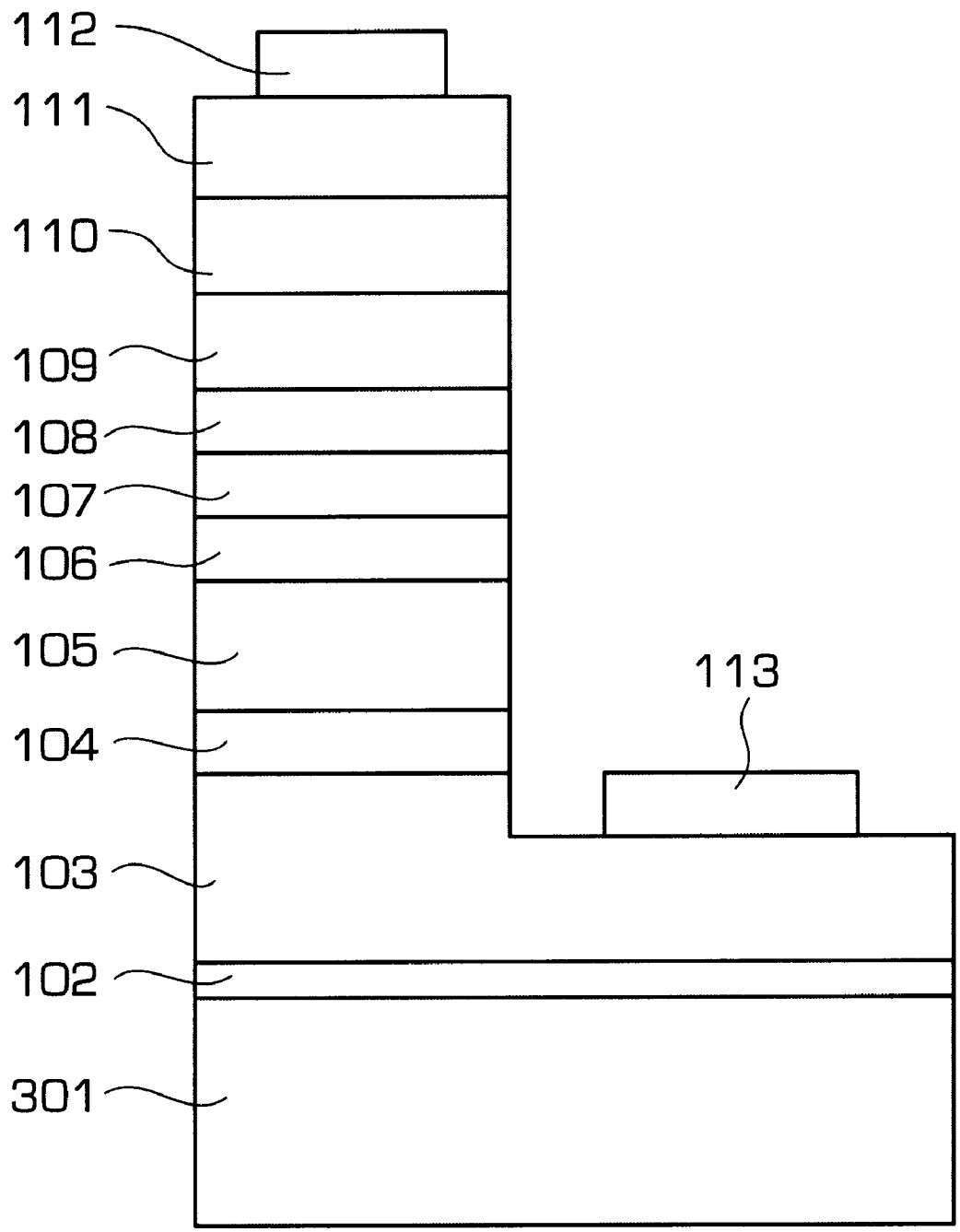
FIG. 3 is a schematic perspective view of a laser device produced on the c-face of a sapphire substrate according to a conventional technique.

FIG. 2 is a schematic perspective view of a nitride semiconductor laser device structure produced on the (1,−1,0,0) face of a 6H type silicon carbide substrate according to the present process. In FIG. 2, the nitride semiconductor laser device was produced by forming, on a 6H type silicon carbide substrate 201 whose surface is a (1,−1,0,0) face of 6H type silicon carbide and on which a silicon dioxide film 115 having a linear aperture of 200 μm in width was formed, a gallium nitride buffer layer 102 of 30 nm in thickness, a Si-doped n type gallium nitride layer 103 of 3 μm in thickness, a Si-doped n type $In_{0.1}Ga_{0.85}N$ layer 104 of 0.1 μm in thickness, a Si-doped n type $Al_{0.15}Ga_{0.85}N$ layer 105 of 0.4 μm in thickness, a Si-doped n type gallium nitride layer 106 of 0.1 μm in thickness, a multiple quantum well layer 107 wherein an $In_{0.2}Ga_{0.8}N$ quantum well layer of 2.5 nm in thickness and an $In_{0.05}Ga_{0.95}N$ barrier layer of 5 nm in thickness were repeated 26 times, a Mg-doped p type $Al_{0.2}Ga_{0.8}N$ layer 108 of 20 nm in thickness, a Mg-doped p type gallium nitride layer of 0.1 μm in thickness, a Mg-doped p type $Al_{0.15}Ga_{0.85}N$ layer 110 of 0.4 μm in thickness, and a Mg-doped p type gallium nitride layer 111 of 0.5 μm in thickness, in this order by selective growth.

A study by the present inventors revealed that when a nitride is allowed to grow on the (1,−1,0,0) face of a 6H type silicon carbide substrate, the nitride grows so that the m-face [(1,0−1,0) face] becomes its surface and consequently the axis "c" becomes parallel to the substrate surface. In the device structure of the present Example as well, this (the axis "c" of a nitride formed on a substrate becomes parallel to the substrate surface) was confirmed by X-ray diffractometry. On the gallium nitride layer 111 (which is the uppermost layer) is formed a p electrode 112 consisting of two layers of nickel (Ni) and gold (Au); on the n type gallium nitride layer 103 is formed an n electrode 113 consisting of two layers of titanium (Ti) and aluminum (Al). The formation of semiconductor crystal layers 102, 103, 104, 105, 106, 107, 108, 109, 110 and 111 was conducted by a metalorganic chemical vapor deposition. According to a study by the present inventors, when one side of the aperture of linear selective growth area is directed to the (1,1,−2,0) direction of the surface of the substrate on which crystal growth is to be made, a nitride semiconductor grows on the substrate in a columnar structure so that the side of the column becomes a c-face facet which has the smallest growth speed. The c-face facet formed is a very flat plane and is perpendicular to the substrate surface and, therefore, can be utilized as an excellent cavity mirror surface. In the present Example, by utilizing this phenomenon, the aperture of silicon dioxide is directed to a direction normal to the silicon carbide (1,1,−2,0) face 216 perpendicular to the substrate surface and there is formed, on the substrate, a nitride having, at a side, a flat c-face facet perpendicular to the substrate surface and usable as a cavity mirror surface 114. This cavity mirror surface was confirmed, by observation by a scanning type electron microscope, to be very flat. Further in the laser device of the present Example, since the nitride semiconductor layer has an axis "c" parallel to the substrate surface and has a wurtzite structure of hexagonal system, anisotropic strain is introduced into the c-face of the quantum well active layer and its density of states at around the top of the valence band is lowered. Furthermore, since the component of piezoelectric field perpendicular to the substrate surface is zero, there occurs no reduction in the probability of recombination of electrons and holes and the laser device has a low threshold current density. In this laser device, the threshold current density during 77K laser oscillation was lower than that of a conventional laser device formed on the c-face of a sapphire substrate.

The embodiment of the present Example is not restricted only to the semiconductor layer having a structure of FIG. 2 and is applicable also to when the crystal growth layer formed contains a mixed crystal of any desired composition between indium nitride, aluminum nitride and gallium nitride.

While the preferred embodiments of the present invention have been described using specific terms, such description is for illustrative purposes only, and it is to be understood that changes and variations may be made without departing from the spirit or scope of the following claims.

What is claimed is:

1. A process for producing a semiconductor light-emitting device, which comprises forming, on a surface of a substrate by crystal growth, a gallium nitride type compound semiconductor layer having a crystal face (0,0,0,1) which is utilized as an end surface of an optical waveguide or as a cavity mirror surface, wherein the crystal growth is conducted on the substrate selectively.

2. A process according to claim 1, wherein the gallium nitride type compound semiconductor layer comprises a layer of one kind selected from gallium nitride, aluminum nitride and indium nitride, or a layer of a mixed crystal of at least two kinds selected from the above nitrides.

3. A process according to claim 1, wherein the axis "c" of the gallium nitride type compound crystal is parallel to the surface of the substrate.

4. A process according to claim 2, wherein the axis "c" of the gallium nitride type compound crystal is parallel to the surface of the substrate.

5. A process according to claim 1, wherein the surface of the substrate on which crystal growth is to be conducted, is the r-face ((1,−1,0,2) face) of sapphire.

6. A process according to claim 2, wherein the surface of the substrate on which crystal growth is to be conducted, is the r-face ((1,−1,0,2) face) of sapphire.

7. A process according to claim 1, wherein the surface of the substrate on which crystal growth is to be conducted, is the (1,0−1,0) face of hexagonal system silicon carbide.

8. A process according to claim 2, wherein the surface of the substrate on which crystal growth is to be conducted, is the (1,0,−1,0) face of hexagonal system silicon carbide.

9. A process according to claim 5, wherein one side of the selective crystal growth area is the (1,1,−2,0) direction of the substrate surface on which crystal growth is to be conducted.

10. A process according to claim 6, wherein one side of the selective crystal growth area is the (1,1,−2,0) direction of the substrate surface on which crystal growth is to be conducted.

11. A process according to claim 7, wherein one side of the selective crystal growth area is the (1,1,−2,0) direction of the substrate surface on which crystal growth is to be conducted.

12. A process according to claim 8, wherein one side of the selective crystal growth area is the (1,1,−2,0) direction of the substrate surface on which crystal growth is to be conducted.

* * * * *

UNITED STATES PATENT AND TRADEMARK OFFICE
CERTIFICATE OF CORRECTION

PATENT NO. : 6,100,106
DATED : August 8, 2000
INVENTOR(S) : Atsushi Yamaguchi, et al.

It is certified that error appears in the above-identified patent and that said Letters Patent is hereby corrected as shown below:

Column 4, line 28, delete "(1,0-1,0)" insert (1,0, -1,0)--;

line 41, after "the" insert --r--

Column 5, line 58, delete "$Ga_{0.85}$" insert --$Ga_{0.9}$--

Column 6, line 6, delete "(1,0-1,0)" insert --(1,0, -1,0)--

Column 7, line 20, delete "(1,0-1,0)" insert --(1,0, -1,0)--

Signed and Sealed this

Eighth Day of May, 2001

Attest:

NICHOLAS P. GODICI

Attesting Officer     Acting Director of the United States Patent and Trademark Office